(12) United States Patent
Oh et al.

(10) Patent No.: US 12,724,310 B2
(45) Date of Patent: Sep. 1, 2026

(54) DISPLAY DEVICE

(71) Applicant: Samsung Display Co., LTD., Yongin-si (KR)

(72) Inventors: Myong Soo Oh, Asan-si (KR); Hee Jong Shin, Seoul (KR); Hyun Chul Jin, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 770 days.

(21) Appl. No.: 17/713,248

(22) Filed: Apr. 5, 2022

(65) Prior Publication Data

US 2022/0328439 A1 Oct. 13, 2022

(30) Foreign Application Priority Data

Apr. 12, 2021 (KR) ........................ 10-2021-0046913

(51) Int. Cl.
*G02F 1/1345* (2006.01)
*H10D 86/40* (2025.01)
(Continued)

(52) U.S. Cl.
CPC ....... *G02F 1/13458* (2013.01); *H10D 86/441* (2025.01); *H10D 86/60* (2025.01); *H10W 72/325* (2026.01); *H10W 72/351* (2026.01); *H10W 72/354* (2026.01); *H10W 72/90* (2026.01); *H10W 72/921* (2026.01);
(Continued)

(58) Field of Classification Search
CPC ............. G02F 1/13452; G02F 1/13458; G02F 1/13454; H05K 3/323; H05K 3/361; H05K 1/111; H05K 2201/09409; H05K 2201/094; G09G 2300/0426; G09G 3/3648;
(Continued)

(56) References Cited

U.S. PATENT DOCUMENTS 9,741,278 B2 8/2017 Kang et al.
10,707,280 B2 7/2020 Jeong et al.
(Continued)

FOREIGN PATENT DOCUMENTS

JP 04281431 A * 10/1992
JP 3608226 1/2005
(Continued)

OTHER PUBLICATIONS

JPH04281431A Translation (Year: 1992).*

*Primary Examiner* — Jessica S Manno
*Assistant Examiner* — Victor Joseph Lasasso
(74) *Attorney, Agent, or Firm* — Sughrue Mion, PLLC

(57) ABSTRACT

A display device includes a display area; a pad area including a first pad for supplying a data signal to the display area, second pads for transmitting a DC signal, and a dummy pad, wherein each of the first pad, the second pads, and the dummy pad has a surface as a top face thereof, wherein each of the surface of the first pad, the surface of the second pads, and the surface of the dummy pad has a corresponding vertical level in a thickness direction of the display device, wherein the vertical level of the surface of each of the second pads is higher than the vertical level of the surface of the first pad, wherein the vertical level of the surface of the dummy pad is lower than or equal to the vertical level of the surface of the first pad.

20 Claims, 19 Drawing Sheets

(51) Int. Cl.

| | |
|---|---|
| ***H10D 86/60*** | (2025.01) |
| ***H10H 29/49*** | (2025.01) |
| ***H10W 72/30*** | (2026.01) |
| ***H10W 72/90*** | (2026.01) |
| ***H10W 90/00*** | (2026.01) |

(52) U.S. Cl.
CPC ........ *H10W 72/923* (2026.01); *H10W 72/927* (2026.01); *H10W 72/932* (2026.01); *H10W 72/944* (2026.01); *H10W 72/963* (2026.01); *H10W 72/967* (2026.01); *H10W 72/981* (2026.01); *H10W 90/00* (2026.01); *H10W 90/734* (2026.01)

(58) Field of Classification Search
CPC ......... G09G 2310/0275; G09G 3/3225; H10H 29/49; H10W 72/263
See application file for complete search history.

(56) References Cited

U.S. PATENT DOCUMENTS

| | | | | |
|---|---|---|---|---|
| 11,264,434 | B2 | 3/2022 | Jeong et al. | |
| 11,696,474 | B2 | 7/2023 | Lim et al. | |
| 11,730,025 | B2 | 8/2023 | Jang et al. | |
| 2003/0043104 | A1* | 3/2003 | Lee | G09G 3/3677 345/100 |
| 2006/0238450 | A1* | 10/2006 | Onodera | G02F 1/13452 345/60 |
| 2012/0299888 | A1* | 11/2012 | Kim | G02F 1/13458 345/55 |
| 2018/0063954 | A1* | 3/2018 | Kim | H05K 1/0268 |
| 2018/0190225 | A1* | 7/2018 | Chen | G09G 3/3666 |
| 2022/0149329 | A1 | 5/2022 | Jeong et al. | |
| 2023/0301150 | A1 | 9/2023 | Lim et al. | |
| 2023/0337495 | A1 | 10/2023 | Jang et al. | |

FOREIGN PATENT DOCUMENTS

| | | |
|---|---|---|
| KR | 10-2006-0011607 | 2/2006 |
| KR | 1630320 | 6/2016 |
| KR | 9741278 | 11/2016 |
| KR | 10-2018-0119198 | 11/2018 |
| KR | 10-2021-0025167 | 3/2021 |
| KR | 10-2021-0037801 | 4/2021 |

* cited by examiner

DISPLAY DEVICE

CROSS REFERENCE TO RELATED APPLICATION

This application claims priority from and the benefit of Korean Patent Application No. 10-2021-0046913, filed on Apr. 12, 2021, which is hereby incorporated by reference for all purposes as if fully set forth herein.

BACKGROUND

Field

Embodiments of the invention relate generally to a display device.

Discussion of the Background

As information society develops, demand for a display device for displaying an image is increasing in various forms. For example, the display device is applied to various electronic devices such as smart phones, digital cameras, notebook computers, navigation systems, and smart televisions. The display device may include a flat panel display device such as an organic light-emitting display device (OLED), an inorganic light-emitting display device (inorganic EL), a quantum dot light-emitting display device (QED), a micro LED display device (micro-LED), a nano LED display device (nano-LED), a plasma display device (PDP), a field emission display device (FED), a cathode ray display device (CRT), a liquid crystal display device (LCD), or an electrophoretic display device (EPD). The organic light-emitting display device (OLED) may include an organic light-emitting layer. The organic light-emitting display device (OLED) may include, but is not limited to, a quantum dot organic light-emitting display device further including a wavelength conversion layer for converting a wavelength of light emitted from the organic light-emitting layer.

The display device may include a display panel that creates a screen, a printed circuit film to deliver an external signal to a pixel of the display panel, and a driving integrated circuit mounted on the display panel to transmit the external signal provided via the printed circuit film to the pixel of the display panel.

The display panel includes pads connected to the driving integrated circuit, and pads not connected to the driving integrated circuit. When a step occurs between the pads connected to the driving integrated circuit and the pads not connected to the driving integrated circuit, bonding reliability of the pads to the printed circuit film may be degraded.

The above information disclosed in this Background section is only for understanding of the background of the inventive concepts, and, therefore, it may contain information that does not constitute prior art.

SUMMARY

Devices constructed according to illustrative implementations of the invention are capable of improved bonding reliability.

A purpose of the present disclosure is to provide a display device with improved bonding reliability between the printed circuit film and the pads of the display panel.

Additional features of the inventive concepts will be set forth in the description which follows, and in part will be apparent from the description, or may be learned by practice of the inventive concepts.

A display device according to one embodiment includes a display area; a pad area, wherein the pad area contains therein a first pad for supplying a data signal to the display area, a plurality of second pads located outside the first pad for transmitting a direct current (DC) signal, and a dummy pad located between the first pad and a group of the plurality of second pads, wherein each of the first pad, the plurality of second pads, and the dummy pad has a surface as a top face thereof, wherein each of the surface of the first pad, the surface of the plurality of second pads, and the surface of the dummy pad has a vertical level in a thickness direction of the display device, wherein the vertical level of the surface of the plurality of second pads is higher than the vertical level of the surface of the first pad, wherein the vertical level of the surface of the dummy pad is lower than or equal to the vertical level of the surface of the first pad.

A display device according to another embodiment includes a display area; and a pad area, wherein the pad area contains therein a first pad for supplying a data signal to the display area, a plurality of second pads located outside the first pad for transmitting a direct current (DC) signal, and a dummy pad located between the first pad and a group of the plurality of second pads, wherein the display device further comprises: a substrate; a first conductive layer on the substrate; a buffer layer on the first conductive layer; a gate insulating layer on the buffer layer; a first interlayer insulating layer on the gate insulating layer; and a second conductive layer on the first interlayer insulating layer, wherein at least one of the plurality of second pads includes a lower pad, and an upper pad, wherein the upper pad overlaps the lower pad in a thickness direction of the display device, and is electrically connected to the lower pad, wherein the first conductive layer includes the lower pad, wherein the second conductive layer includes the upper pad and the first pad, wherein the dummy pad is disposed in the first conductive layer, or the second conductive layer.

Specific details of other embodiments are included in the detailed description and drawings.

According to the embodiments, the bonding reliability between the pads of the display panel and the printed circuit film may be improved.

Effects according to the embodiments are not limited to the effect as described above. Various effects as not mentioned above are included herein.

It is to be understood that both the foregoing general description and the following detailed description are illustrative and explanatory and are intended to provide further explanation of the invention as claimed.

BRIEF DESCRIPTION OF DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
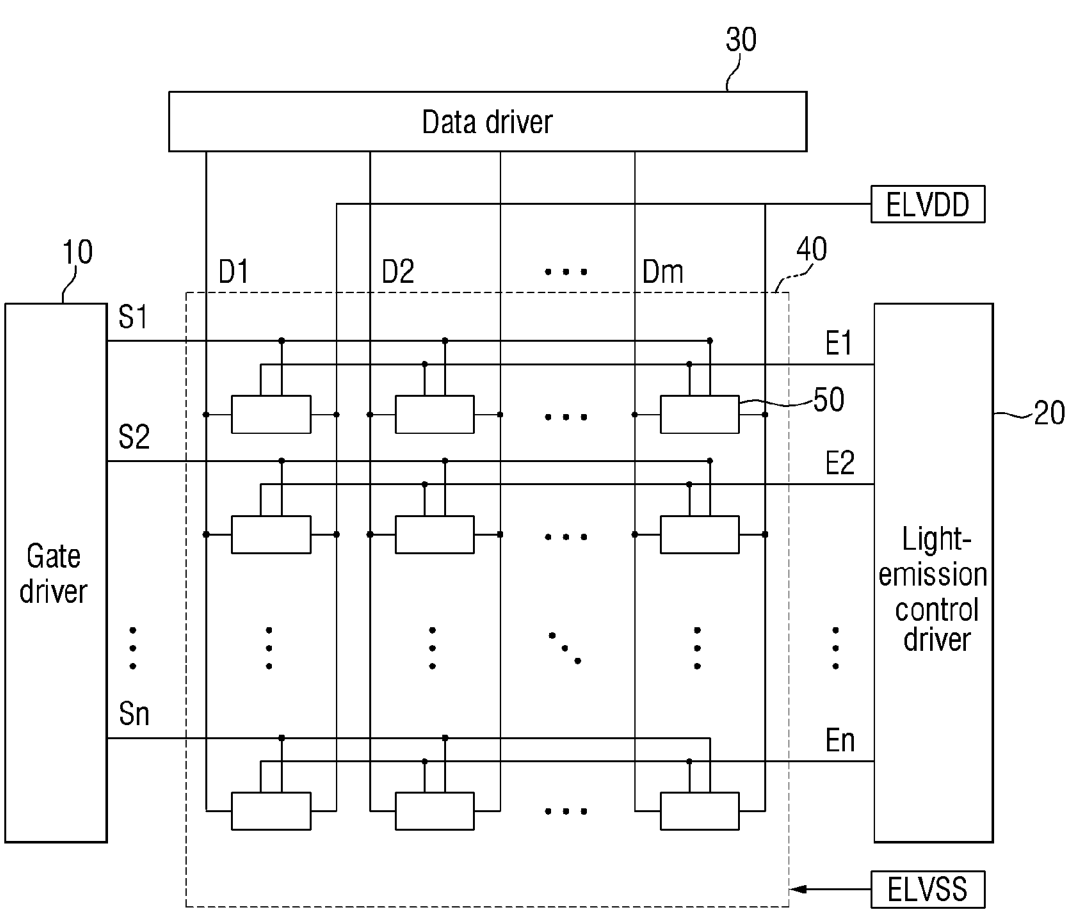
FIG. 1 is a block diagram of a display device according to one embodiment that is constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, embodiments of the invention will be described with reference to the attached drawings.

FIG. 1 is a block diagram of a display device according to one embodiment that is constructed according to principles of the invention.

Referring to FIG. 1, the display device may include a gate driver 10, a light-emission control driver 20, a data driver 30, and a pixel array 40. The pixel array 40 includes a plurality of pixels 50.

The gate driver 10 generates a gate signal in response to driving power and control signals supplied from outside of the display device, and sequentially supplies the gate signal to gate lines S1 to Sn. Then, the pixels 50 are selected based on the gate signal and then sequentially receive a data signal.

The light-emission control driver 20 sequentially supplies a light-emission control signal to light-emission control lines E1 to En extending in a parallel manner to the gate lines S1 to Sn in response to the driving power and the control signals supplied from the outside. Then, light emissions from the pixels 50 are controlled based on the light-emission control signal.

Each of the gate driver 10 and the light-emission control driver 20 together with a pixel circuit included in the pixel array 40 may be implemented in a form of a thin film transistor on a substrate, or may be mounted in a form of a chip on the substrate. Positions of the gate driver 10 and the light-emission control driver 20 are not limited to an illustrated example. Depending on a structure of each of the pixels, the light-emission control driver 20 may be omitted in certain implementations of this embodiment.

The data driver 30 generates a data signal in response to data and control signals supplied from the outside, and supplies the data signal to data lines D1 to Dm. The data signal supplied to the data lines D1 to Dm is supplied to the pixels 50 selected based on the gate signal whenever the gate signal is supplied. Then, the pixels 50 charge a voltage corresponding to the data signal therein.

The pixel array 40 includes the plurality of pixels 50 respectively positioned at intersections between the gate lines S1 to Sn and the data lines D1 to Dm. The pixel array 40 receives first power ELVDD as high-potential pixel power and second power ELVSS as low-potential pixel power. The first power ELVDD and the second power ELVSS are delivered to each of the pixels 50.

Then, the pixels 50 emits light having a luminance corresponding to a driving current flowing from the first power ELVDD to the second power ELVSS in response to the data signal, thereby displaying an image.

Figure 2:
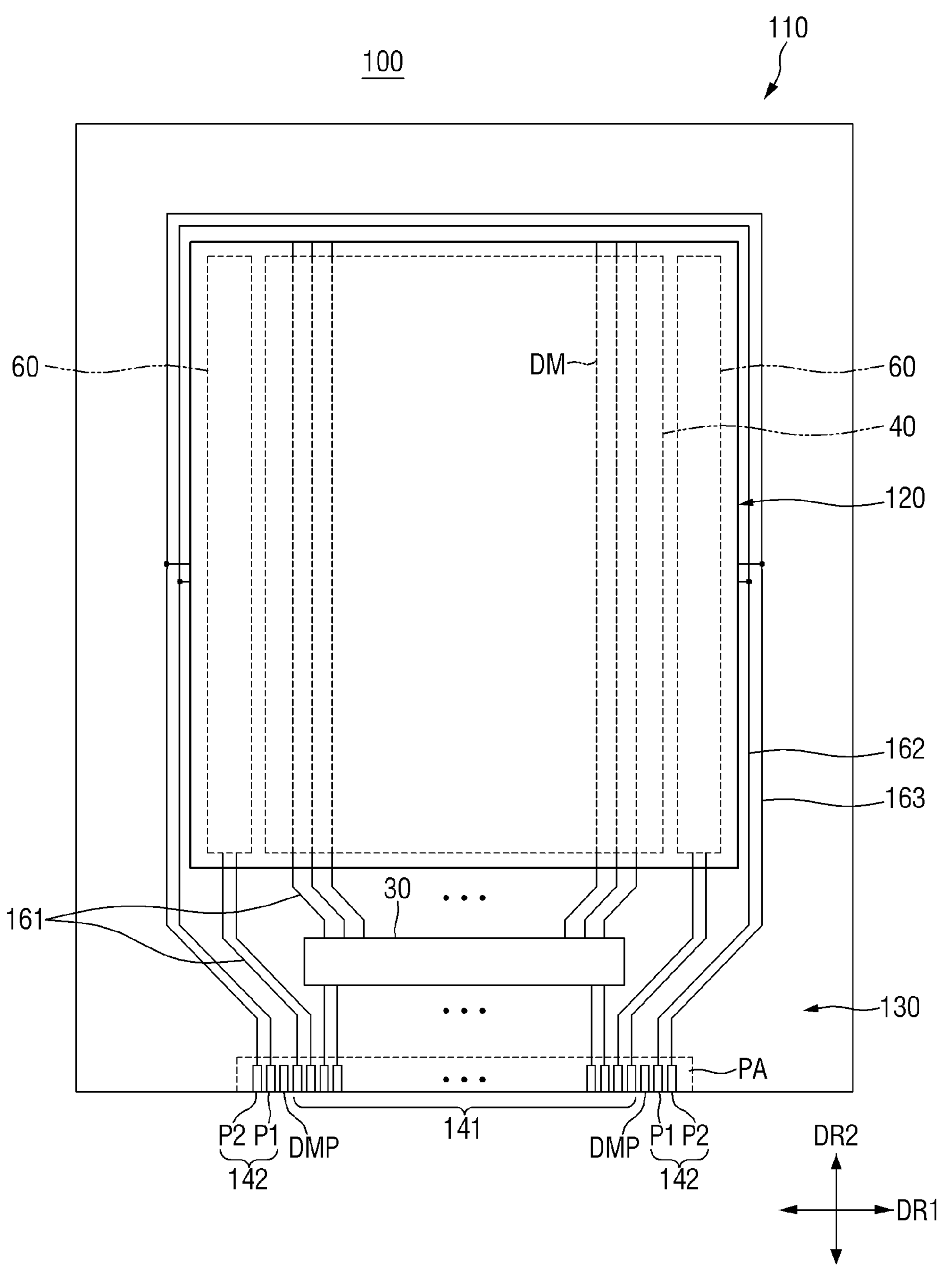
FIG. 2 is a plan view of a display device according to one embodiment.
Figure 3:
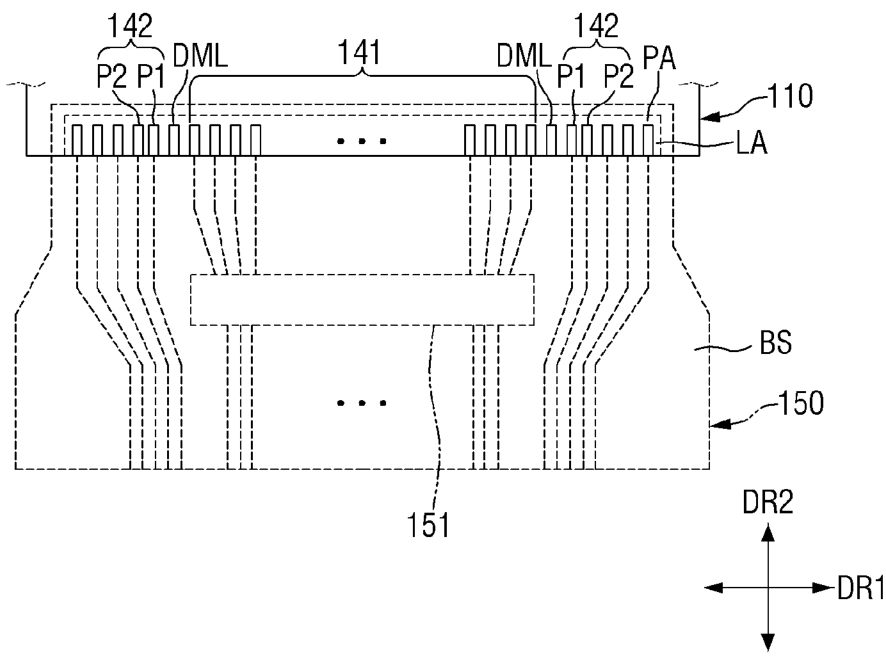
FIG. 3 is a plan view showing a pad area and a printed circuit film attached to the pad area of FIG. 2.
Figure 4:
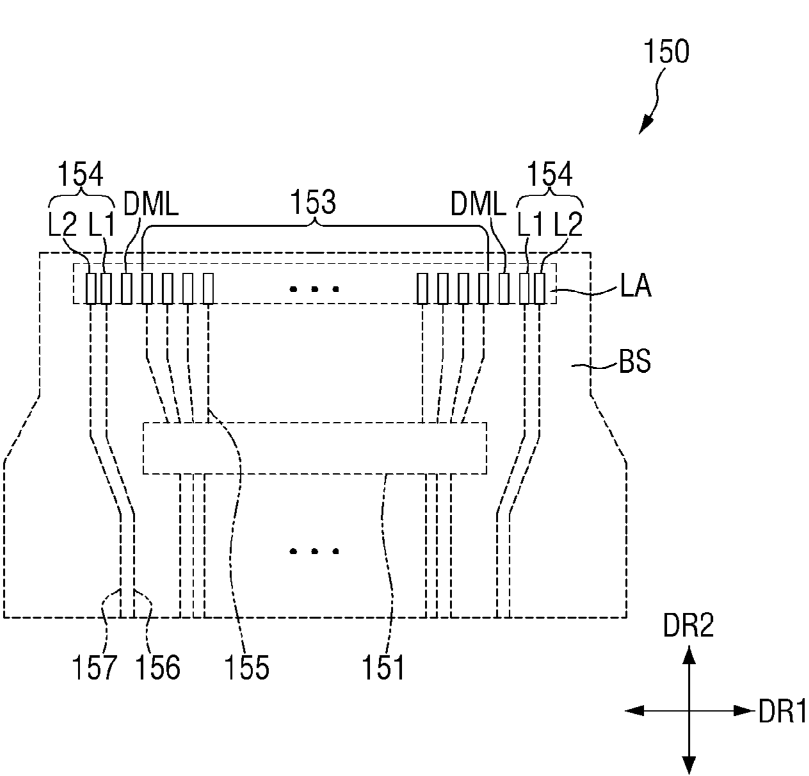
FIG. 4 is a plan view showing a printed circuit film according to one embodiment.

FIG. 2 is a plan view of a display device according to one embodiment. FIG. 3 is a plan view showing a pad area and the printed circuit film attached to the pad area of FIG. 2. FIG. 4 is a plan view showing a printed circuit film according to one embodiment.

Referring to FIG. 2 to FIG. 4, a display device 100 includes a substrate 110 on which components of the display device 100 as described later are disposed. The display device 100 may include a display area 120 and a non-display area 130 disposed around the display area 120. The above-described pixel array (40 in FIG. 1) may be disposed in the display area 120, while the pixel array 40 may not be disposed in the non-display area 130. However, the embodiment described herein not limited thereto.

The non-display area 130 may include a pad area PA located on at least one side of the display area 120. The pad area PA may be located on an opposite side thereto in a second direction DR2 of the display area 120. However, the embodiment described herein is not limited thereto.

The pad area PA may be electrically connected to the display area 120.

The display area 120 may include the pixel array 40 and a driving circuitry 60 outside the pixel array 40. The driving circuitry 60 may include the gate driver and the light-emission control driver as aforementioned. A location and the number of the driving circuitry 60 are not limited to the illustrated example. The light-emission control driver may be omitted.

The data driver 30 may be located between the display area 120 and the pad area PA. The data driver 30 may be mounted, in a form of chip-on glass or chip-on plastic, on the substrate 110, or may be included in a driving IC 151 of a printed circuit film 150 attached to the pad area PA. In the latter case, the data driver 30 is not formed on the substrate 110. Hereinafter, description will be made based on a case where the data driver 30 is mounted on the substrate 110.

The pad area PA includes a plurality of pads arranged along an edge of the substrate 110. The plurality of pads are bonded to a lead of the printed circuit film 150, and receive a signal for displaying an image from the printed circuit film 150. Each of the plurality of pads is electrically connected to the display area 120 via each wire.

The pad area PA includes a plurality of first pads 141 that receive a signal via the driving IC 151 of the printed circuit film 150, and a plurality of second pads 142 that are located outside the plurality of first pads 141 and receive a DC (direct current) signal not via the driving IC 151. The first pad 141 may be referred to as a signal application pad, while the second pad 142 may be referred to as a bypass pad. The first pad 141 may be connected to the data driver 30, while the second pad 142 may not be connected to the data driver 30. In one example, the pad area PA may further include a dummy pad DMP disposed between the first pad 141 and a group of the plurality of second pads 142.

Each of the plurality of first pads 141 may be connected to the driving circuitry 60 and the data driver 30 via a first wire 161.

The DC signal may include a first power signal and a second power signal greater than the first power signal. The first power signal may act as the first power ELVDD, while the second power signal may act as the second power ELVSS.

The plurality of second pads 142 may include a first power pad P1 for supplying the first power ELVDD to the display area 120 and a second power pad P2 for supplying the second power ELVSS to the display area 120. The first power pad P1 is connected to the display area 120 via a first power wire 162, while the second power pad P2 is connected to the display area 120 via a second power wire 163.

In one example, unlike the first and second pads 141 and 142, the dummy pad DMP may be embodied as a floating electrode, as shown in FIG. 2.

The printed circuit film 150 includes a base film BS facing the substrate 110. The printed circuit film 150 may include a lead area LA in which a first lead 153 and a plurality of second leads 154 provided on one face of the base film BS facing the substrate 110 are disposed. The lead area LA may further include a dummy lead DML disposed between the first lead 153 and a group of the plurality of second leads 154.

The first lead 153 may overlap the first pad 141, and may be electrically connected thereto.

The plurality of second leads 154 may include a first power lead L1 overlapping the first power pad P1 and electrically connected thereto, and a second power lead L2 overlapping the second power pad P2 and electrically connected thereto.

The first lead 153 may be connected to the driving IC 151 of the printed circuit film 150 via a first lead wire 155, while the first power lead L1 and the second power lead L2 may not be connected to the driving IC 151. That is, each of a first power lead wire 156 connected to the first power lead L1 and a second power lead wire 157 connected to the second power lead L2 may not be connected to the driving IC 151.

The dummy lead DML may not be connected to the driving IC 151, as shown in FIG. 4. That is, like the dummy pad DMP, the dummy lead DML may be embodied as a floating electrode. In some embodiments, the dummy lead DML may be electrically connected to the dummy pad DMP in FIG. 2.

Figure 5:
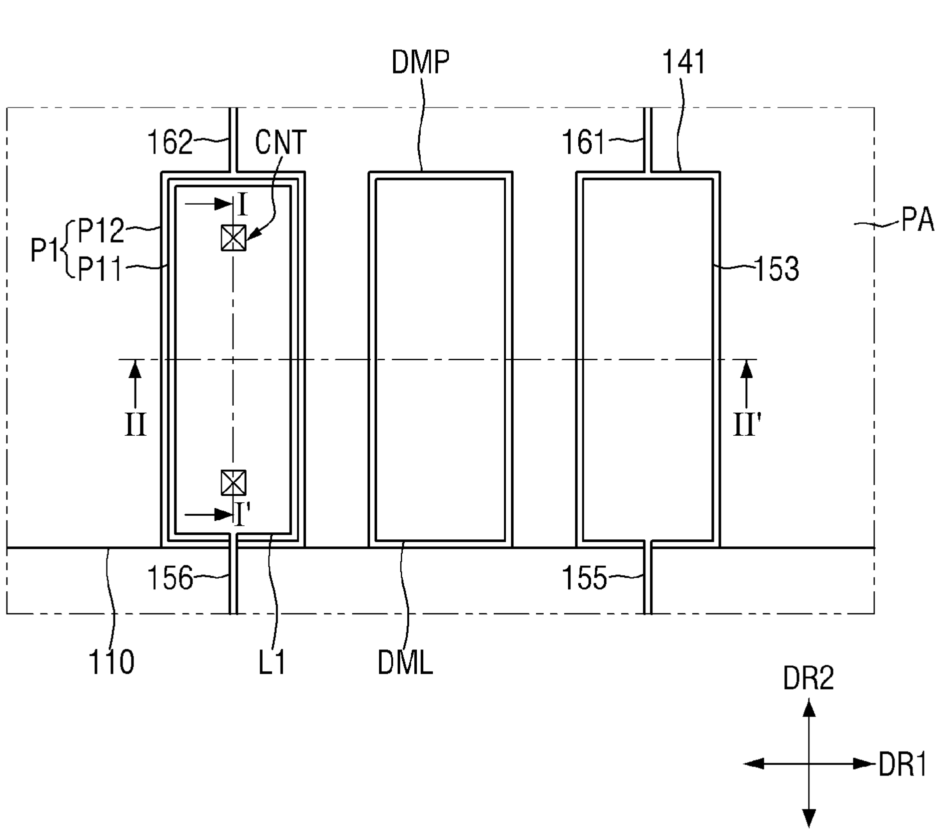
FIG. 5 is an enlarged plan view of the pad area and the printed circuit film of FIG. 3.
Figure 6:
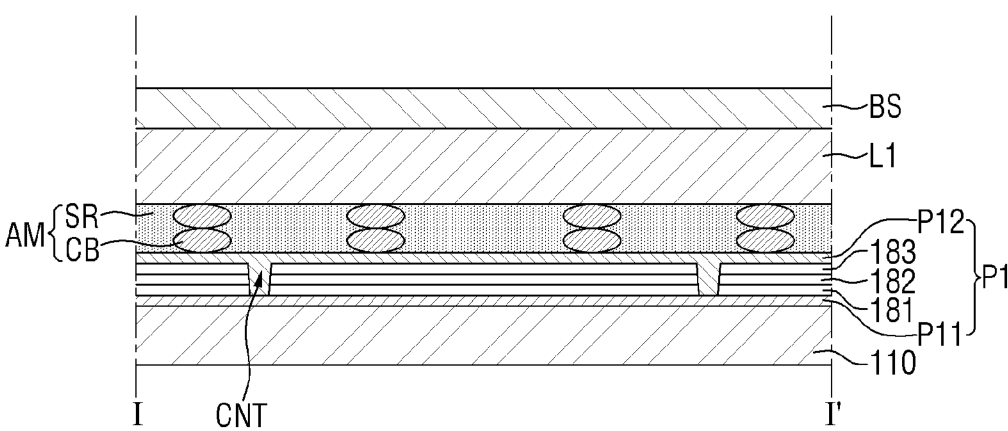
FIG. 6 is a cross-sectional view taken along a line I-I' in FIG. 5.
Figure 7:
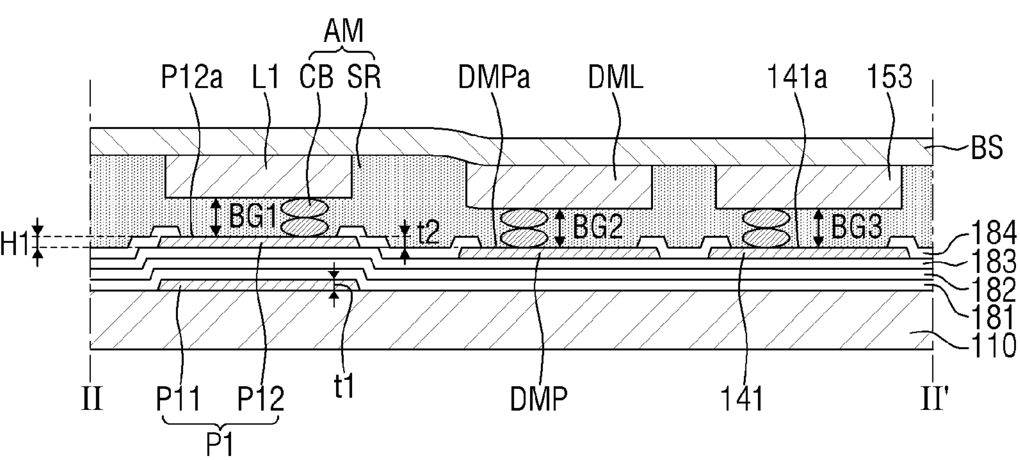
FIG. 7 is a cross-sectional view taken along a line in FIG. 5.

FIG. 5 is an enlarged plan view of the pad area and the printed circuit film of FIG. 3. FIG. 6 is a cross-sectional view taken along a line I-I' in FIG. 5. FIG. 7 is a cross-sectional view taken along a line in FIG. 5.

First, referring to FIG. 5, the first pad 141 may be connected to the first wire 161. The first pad 141 may be integrally formed with and connected to the first wire 161. The first power pad P1 may include a first lower power pad P11, and a first upper power pad P12 overlapping the first lower power pad P11 in a thickness direction and electrically connected thereto. The second pad P2 may have the same stack structure as that of the first pad P1. Therefore, hereinafter, a detailed description of the second power pad P2 will be omitted for convenience of description.

The first upper power pad P12 may be connected to the first power wire 162. The first upper power pad P12 may be integrally formed with and connected to the first power wire 162.

In a plan view, the dummy pad DMP may be disposed between the first pad 141 and the first power pad P1.

The first lead 153 may overlap the first pad 141. The second lead L1 may overlap the first power pad P1. The dummy lead DML may overlap the dummy pad DMP.

Next, with reference to FIGS. 5 and 6, a detailed stacking structure of the pad area PA of the display device will be described.

Referring to FIGS. 5 and 6, a display device according to one embodiment may include a substrate 110, a first conductive layer, a buffer layer 181, a gate insulating layer 182, a first interlayer insulating layer 183, and a second conductive layer. The display device according to one embodiment may further include the printed circuit film 150 as described above, and an anisotropic conductive film AM disposed between the pad area PA and the lead area LA of the printed circuit film 150.

The substrate 110 may include a transparent insulating substrate. For example, the substrate 110 may be embodied as a transparent resin substrate having flexibility. The transparent resin substrate may include a polyimide-based resin, an acrylic acryl-based resin, a polyacrylate-based resin, a polycarbonate-based resin, a polyether-based resins, a sulfonic acid-based resin, a polyethylene terephthalate-based resin, etc. Preferably, the substrate 110 may be embodied as a polyimide (PI) resin film.

The first conductive layer may include the first lower power pad P11 of the first power pad P1. As described above, the first lower power pad P11 may overlap the first upper power pad P12 in the thickness direction.

The first lower power pad P11 may be electrically connected to the first upper power pad P12. The first lower power pad P11 may be electrically connected to first upper power pad P12 such that an overall resistance of the first power pad P1 may be lowered.

The first conductive layer may include at least one metal selected from a group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The first lower power pad P11 may have a first thickness t1.

The buffer layer 181 may be disposed on the first conductive layer.

The buffer layer 181 may prevent diffusion of metal atoms or impurities from the substrate 110.

The buffer layer 181 may be made of a silicon compound such as silicon oxide ($SiO_X$), silicon nitride (SiNx silicon oxynitride ($SiO_XN_Y$), silicon oxycarbide ($SiO_XC_Y$), and silicon carbonitride ($SiC_XN_Y$).

The buffer layer 181 may be disposed directly on the first conductive layer. The buffer layer 181 may be directly disposed on the first lower power pad P11 of the first conductive layer. The buffer layer 181 may be disposed on the first lower power pad P11 in a conformal manner. That is, the buffer layer 181 may have a step conformal to a step of the first lower power pad P11. Accordingly, a portion of one face of the buffer layer 181 that overlaps the first lower power pad P11 may protrude upwardly to have a vertical level higher than that of a portion of one face of the buffer layer 181 that does not overlap the first lower power pad P11.

For example, when the first lower power pad P11 has the first thickness t1, a portion of one face of the buffer layer 181 that overlaps the first lower power pad P11 may protrude upwardly to have a vertical level higher by the first thickness t1 than that of a portion of one face of the buffer layer 181 that does not overlap the first lower power pad P11.

A gate insulating layer 182 may be disposed on the buffer layer 181.

The gate insulating layer 182 may include an inorganic insulating material such as silicon oxide, silicon nitride, silicon oxynitride, hafnium oxide, aluminum oxide, titanium oxide, tantalum oxide, and zinc oxide.

The first interlayer insulating layer 183 may be disposed on the gate insulating layer 182.

The first interlayer insulating layer 183 may include an inorganic insulating material such as silicon oxide, silicon nitride, silicon oxynitride, hafnium oxide, aluminum oxide, titanium oxide, tantalum oxide, and zinc oxide.

Like the buffer layer 181, each of the gate insulating layer 182 and the first interlayer insulating layer 183 as described above may have a step conformal to the step formed due to the first lower power pad P11. Therefore, a portion of one face of each of the gate insulating layer 182 and the first interlayer insulating layer 183 which overlaps the first lower power pad P11 may protrude upwardly to have a vertical level higher than that of a portion of one face of each of the gate insulating layer 182 and the first interlayer insulating layer 183 which does not overlap the first lower power pad P11.

For example, when the first lower power pad P11 has the first thickness t1, the portion of one face of each of the gate insulating layer 182 and the first interlayer insulating layer 183 that overlaps the first lower power pad P11 may protrude upwardly to have a vertical level higher by the first thickness t1 than that of the portion of one face of each of the gate insulating layer 182 and the first interlayer insulating layer 183 that does not overlap the first lower power pad P11.

The second conductive layer may be disposed on the first interlayer insulating layer 183. The second conductive layer may include the first upper power pad P12, the dummy pad DMP, and the first pad 141, as shown in FIG. 7. The first upper power pad P12, the dummy pad DMP, and the first pad 141 may be coplanar with each other and may be made of the same material, and may be formed using the same process. Each of the first upper power pad P12, the dummy pad DMP, and the first pad 141 of the second conductive layer may have a second thickness t2.

The second thickness t2 may be equal to the first thickness t1.

The second conductive layer may include a non-transparent conductive layer.

The second conductive layer may include at least one metal selected from a group consisting of aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), copper (Cu), and molybdenum (Mo). The second conductive layer may be embodied as a single film as shown in the drawing. However, the present disclosure is not limited thereto. The second conductive layer may be embodied as a multilayer film. For example, the second conductive layer may be formed in a stacked structure such as Ti/Al/Ti, Mo/Al/Mo, Mo/AlGe/Mo, and Ti/Cu.

The first upper power pad P12 may be electrically connected to the first lower power pad P11 via a contact hole CNT passing through the first interlayer insulating layer 183, the gate insulating layer 182, and the buffer layer 181.

A second interlayer insulating layer 184 may be disposed on the second conductive layer.

The second interlayer insulating layer 184 may include an inorganic insulating material such as silicon oxide, silicon nitride, silicon oxynitride, hafnium oxide, aluminum oxide, titanium oxide, tantalum oxide, and zinc oxide, or an organic insulating material such as polyacrylates resin, epoxy resin, phenolic resin, polyamides resin, polyimides rein, unsaturated polyesters resin, poly phenylenethers resin, polyphenylenesulfides resin, benzocyclobutene (BCB), etc.

The second interlayer insulating layer 184 may be disposed on the first pad 141 to expose a center region of the first pad 141, may be disposed on the first power pad P1 to expose a center region of the first power pad P1, and may be disposed on the dummy pad DMP to expose a center region of the dummy pad DMP. More specifically, the second interlayer insulating layer 184 may be disposed on the first power pad P1 to expose a center region of the first upper power pad P12.

As shown in FIG. 7, a vertical level of a surface P12*a* of the first upper power pad P12 may be higher than each of a vertical level of a surface 141*a* of the first pad 141 and a vertical level of a surface DMPa of the dummy pad DMP. Hereinafter, each of the first upper power pad P12, the first pad 141, and the dummy pad DMP has a surface as a top face. Each of the surface of the first upper power pad P12, the surface of the first pad 141, and the surface of the dummy pad DMP may have a vertical level in a thickness direction.

Each of the buffer layer 181, the gate insulating layer 182 and the first interlayer insulating layer 183 may have a step conformal to the step formed due to the first lower power pad P11. Thus, a portion of one face of each of the buffer layer 181, the gate insulating layer 182, and the first interlayer insulating layer 183 which overlaps the first lower power pad P11 may protrude upwardly to have a vertical level higher than that of a portion of one face of each of the buffer layer 181, the gate insulating layer 182, and the first interlayer insulating layer 183 that does not overlap the first lower power pad P11.

Since each of the first upper power pad P12, the dummy pad DMP, and the first pad 141 of the second conductive layer has the second thickness t2, the vertical level of the surface P12*a* of the first upper power pad P12 may be higher by the first thickness t1 than each of the vertical level of the surface 141*a* of the first pad 141 and the vertical level of the surface DMPa of the dummy pad DMP. Hereinafter, each of a step between the vertical level of the surface P12*a* of the first upper power pad P12 and the vertical level of the surface 141*a* of the first pad 141, and a step between the vertical level of the surface P12*a* of the first upper power pad P12 and the surface DMPa of the dummy pad DMP is defined as a first step H1.

The vertical level of the surface P12*a* of the first upper power pad P12 as exposed through the second interlayer insulating layer 184 may be higher by the first thickness t1 than each of the vertical level of the surface 141*a* of the first pad 141 as exposed through the second interlayer insulating layer 184, and the vertical level of the surface DMPa of the dummy pad DMP as exposed through the second interlayer insulating layer 184.

The printed circuit film (150 in FIG. 4) may be disposed on the first upper power pad P12, the dummy pad DMP, and the first pad 141.

The printed circuit film may include the base film BS facing the substrate 110, and the first lead 153, the plurality of second leads L1, and the dummy lead DML provided on one face of the base film BS facing the substrate 110.

The base film BS may include a flexible film. The base film BS may include a polyimide-based resin, an acryl-based resin, a polyacrylate-based resin, a polycarbonate-based resin, a polyether-based resin, a sulfonic acid-based resin, a polyethylene terephthalate-based resin, etc.

The first lead 153 may overlap the first pad 141. The second lead L2 may overlap the first power pad P1. The dummy lead DML may overlap the dummy pad DMP.

The anisotropic conductive film AM may be further disposed between the lead area (LA in FIG. 3) and the pad area PA. The anisotropic conductive film AM may directly contact the second interlayer insulating layer 184, the center region of the first pad 141 as exposed through the second interlayer insulating layer 184, the center region of the first upper power pad P12 as exposed through the second interlayer insulating layer 184, and the center region of the dummy pad DMP as exposed through the second interlayer insulating layer 184.

The anisotropic conductive film AM may include an insulating resin SR and conductive balls CB dispersed in the insulating resin SR. A plurality of conductive ball CBs may be contained in the insulating resin SR.

The first lead 153 and the first pad 141 may be electrically connected to each other via the plurality of conductive balls CB, and the second lead L2 and the first power pad P1 may be electrically connected to each other via the plurality of conductive balls CB. The plurality of conductive ball CB may contact each of the dummy lead DML and the dummy pad DMP.

As the base film BS is made of the flexible material as described above, the base film BS disposed on the first upper power pad P12, the dummy pad DMP, and the first pad 141 may have a downwardly inclined step conformal to the step between the surface P12*a* of the first upper power pad P12 as exposed through the second interlayer insulating layer 184 and the surface 141*a* of the first pad 141 as exposed through the second interlayer insulating layer 184, and the surface DMPa of the dummy pad DMP as exposed through the second interlayer insulating layer 184.

Further, the second leads L1, the dummy lead DML, and the first lead 153 disposed on one face of the base film BS may be arranged in a downwardly inclined manner in a direction from the second lead L1 to the first lead 153. However, since the anisotropic conductive film AM is disposed between the first lead 153, the plurality of second leads L1, and the dummy lead DML and the first upper power pad P12, the dummy pad DMP, and the first pad 141, spacings respectively between the first lead 153, the plurality of second leads L1, and the dummy lead DML and the first pad 141, the first upper power pad P12, and the dummy pad DMP corresponding to the first lead 153, the plurality of second leads L1, and the dummy lead DML, respectively may not be kept uniform.

Specifically, the surface P12*a* of the first upper power pad P12 and the second lead L1 may be spaced from each other by a first bonding gap BG1. The surface DMPa of the dummy pad DMP and the dummy lead DML may be spaced from each other by a second bonding gap BG2. The surface 141*a* of the first pad 141 and the first lead 153 may be spaced from each other by a third bonding gap BG3.

In this embodiment, further including the dummy pad DMP between the first upper power pad P12 and the first pad 141 may allow the second bonding gap BG2 to be larger than each of the first bonding gap BG1 and the third bonding gap BG3, and may allow the third bonding gap BG3 to be smaller than the first bonding gap BG1.

That is, as described above, the vertical level of the surface P12*a* of the first upper power pad P12 as exposed through the second interlayer insulating layer 184 may be higher by the first thickness t1 than each of the vertical level of the surface 141*a* of the first pad 141 as exposed through the second interlayer insulating layer 184, and the vertical level of the surface DMPa of the dummy pad DMP exposed through the second interlayer insulating layer 184. The second leads L1, the dummy lead DML, and the first lead 153 disposed on one face of the base film BS are arranged in a downwardly inclined manner in a direction from the second lead L1 to the first lead 153. Further, since the anisotropic conductive film AM is disposed between the first lead 153, the plurality of second leads L1, and the dummy lead DML and the first upper power pad P12, the dummy pad DMP, and the first pad 141, spacings respectively between the first lead 153, the plurality of second leads L1, and the dummy lead DML and the first pad 141, the first upper power pad P12, and the dummy pad DMP corresponding to the first lead 153, the plurality of second leads L1, and the dummy lead DML, respectively may not be kept uniform. Thus, the second bonding gap BG2 may be larger than each of the first bonding gap BG1 and the third bonding gap BG3. The third bonding gap BG3 may be smaller than the first bonding gap BG1.

When the dummy pad DMP is absent, and the first upper power pad P12 and the first pad 141 are disposed adjacent to each other, the third bonding gap BG3 between the surface 141*a* of the first pad 141 and the first lead 153 may be larger than the first bonding gap BG1 between the surface P12*a* of the first upper power pad P12 and the second lead L1.

Thus, the conductive ball CB between the surface 141*a* of the first pad 141 and the first lead 153 may be compressed in a smaller amount than the conductive ball CB between the surface P12*a* of the first upper power pad P12 and the second lead L1 is. As the conductive ball CB is compressed in a larger amount, a contact area between the conductive ball CB and each of the upper and lower pads and the upper and lower leads may be larger. Therefore, a contact resistance between the surface 141*a* of the first pad 141 and the first lead 153 may be greater than a contact resistance between the surface P12*a* of the first upper power pad P12 and the second lead L1.

However, in one embodiment, further including the dummy pad DMP between the first upper power pad P12 and the first pad 141 may allow the second bonding gap BG2 to be u) larger than each of the first bonding gap BG1 and the third bonding gap BG3 and allow the third bonding gap BG3 to be smaller than the first bonding gap BG1. Thus, the contact resistance between the surface 141*a* of the first pad 141 and the first lead 153 may be prevented from being greater than the contact resistance between the surface P12*a* of the first upper power pad P12 and the second lead L1.

The contact resistance between the surface P12*a* of the first upper power pad P12 and the second lead L1 may be prevented from being larger.

Hereinafter, other embodiments will be described. In following embodiments, the same components as those of the embodiments as already described have the same reference numerals, and the descriptions thereof will be omitted or simplified for ease in explanation of these embodiments.

Figure 8:
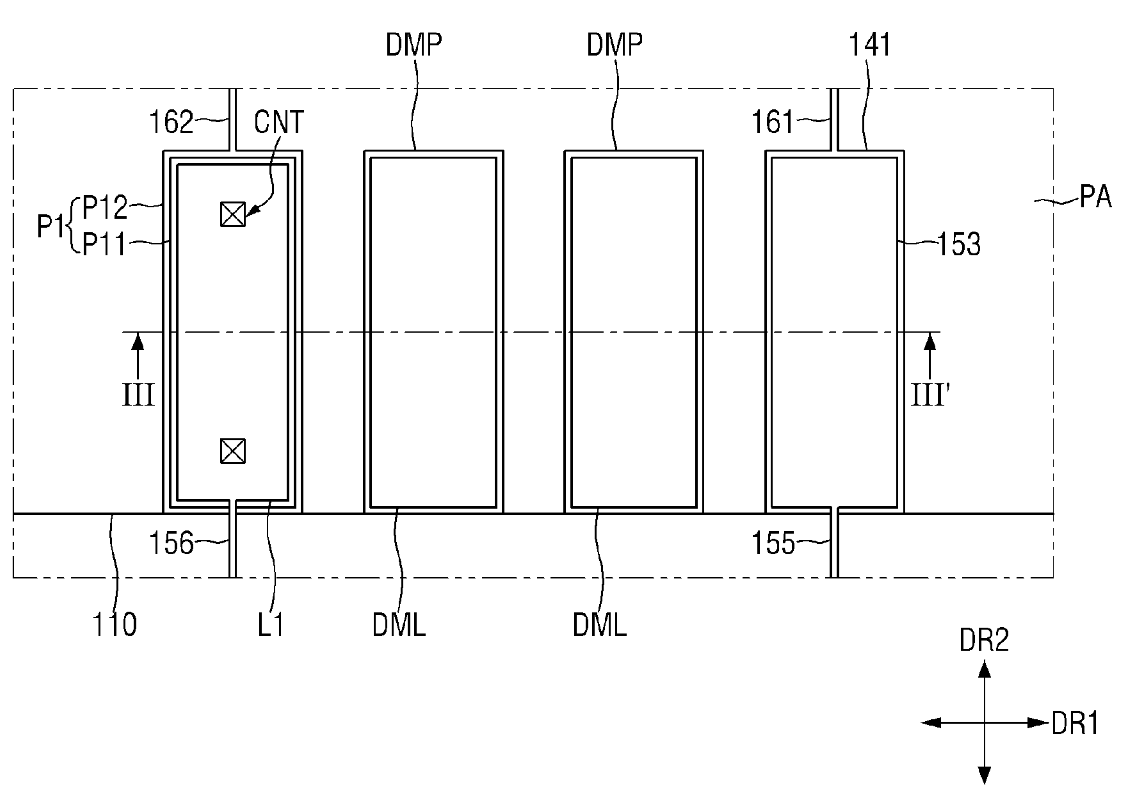
FIG. 8 is an enlarged plan view of a pad area and a printed circuit film attached to the pad area according to another embodiment.
Figure 9:
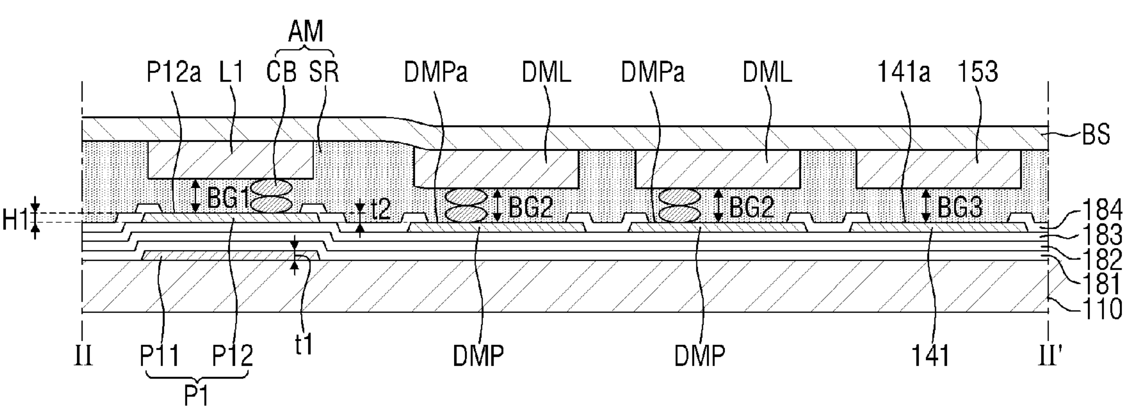
FIG. 9 is a cross-sectional view taken along a line in FIG. 8.

FIG. 8 is an enlarged plan view of a pad area and a printed circuit film attached to the pad area according to another embodiment. FIG. 9 is a cross-sectional view taken along a line in FIG. 8.

Referring to FIGS. 8 and 9, a display device according to this embodiment is different from the display devices according to FIGS. 5 and 7 in that the dummy pad DMP includes a plurality of dummy pads DMP, and the dummy lead DML includes a plurality of the dummy leads DML in this embodiment.

More specifically, the dummy pad DMP includes a plurality of dummy pads DMP, and the dummy lead DML includes a plurality of the dummy leads DML in this embodiment.

The plurality of dummy pads DMP may be disposed between the first upper power pad P12 and the first pad 141, while the plurality of dummy leads DML may be disposed between the second lead L2 and the first lead 153.

In this embodiment, placing two or more dummy pads DMP between the first upper power pad P12 and the first pad 141 may allow the contact resistance between the surface 141*a* of the first pad 141 and the first lead 153 to be more effectively prevented from becoming larger than the contact resistance between the surface P12*a* of the first upper power pad P12 and the second lead L1.

Figure 10:
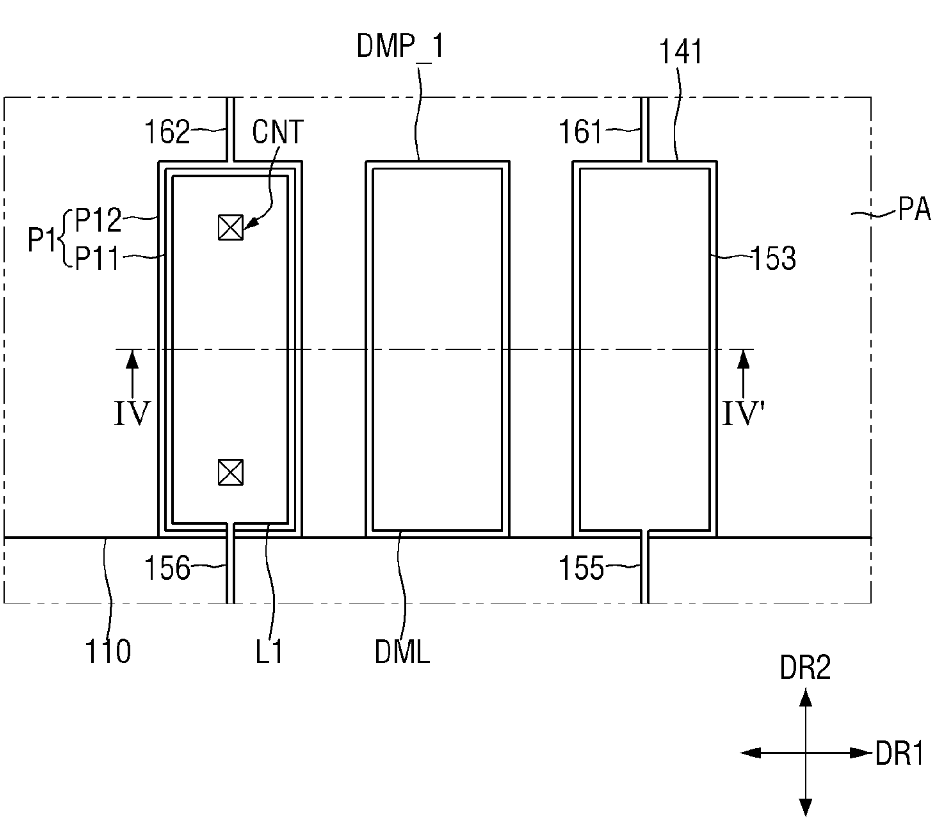
FIG. 10 is an enlarged plan view of a pad area and a printed circuit film attached to the pad area according to still another embodiment.
Figure 11:
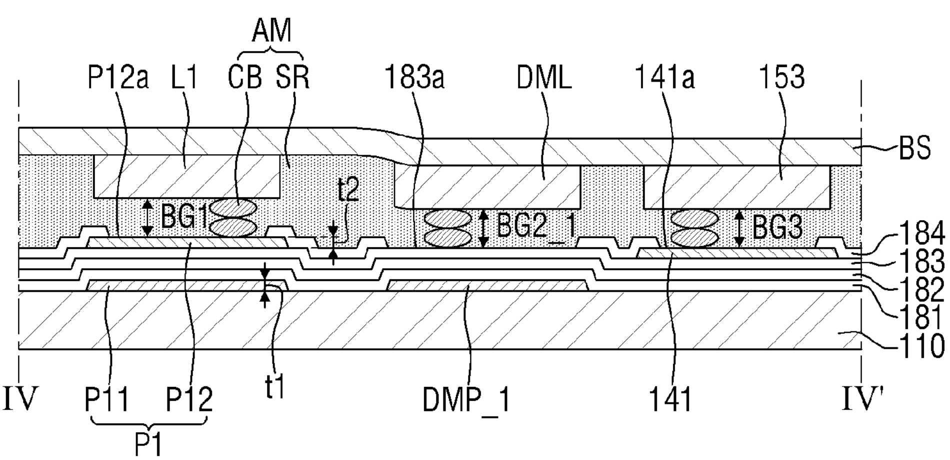
FIG. 11 is a cross-sectional view taken along a line IV-IV' in FIG. 10.

FIG. 10 is an enlarged plan view of a pad area and a printed circuit film attached to the pad area according to still another embodiment. FIG. 11 is a cross-sectional view taken along a line IV-IV' in FIG. 10.

Referring to FIG. 10 and FIG. 11, a display device according to this embodiment differs from the display device according to FIGS. 5 and 8 in that the first conductive layer includes a dummy pad DMP_1, and the second conductive layer does not include the dummy pad in this embodiment.

More specifically, the first conductive layer of the display device according to this embodiment may include the dummy pad DMP_1, while the second conductive layer may not include the dummy pad.

The first conductive layer may have a first thickness t1, and the second conductive layer may have a second thickness t2.

The surface P12*a* of the first upper power pad P12 and the second lead L1 may be spaced from each other by the first bonding gap BG1. A top face 183*a* of the first interlayer insulating layer 183 (on an overlapping area with the dummy pad DMP_1) and the dummy lead DML may be spaced from each other by the second bonding gap BG2_1. The surface 141*a* of the first pad 141 and the first lead 153 may be spaced from each other by the third bonding gap BG3.

Since each of the first lower power pad P11 and the dummy pad DMP_1 of the first conductive layer has the first thickness t1 while each of the first upper power pad P12 and the first pad 141 of the second conductive layer has the second thickness t2, the vertical level of the surface P12*a* of the first upper power pad P12 may be higher by the second thickness t2 than the vertical level of the top face 183*a* of the first interlayer insulating layer 183 on the area overlapping the dummy pad DMP_1.

In this embodiment, further including the dummy pad DMP_1 between the first upper power pad P12 and the first pad 141 may allow the second bonding gap BG2_1 to be larger than each of the first bonding gap BG1 and the third bonding gap BG3, and allow the third bonding gap BG3 to be smaller than the first bonding gap BG1. Thus, the contact resistance between the surface 141*a* of the first pad 141 and the first lead 153 may be prevented from being greater than the contact resistance between the surface P12*a* of the first upper power pad P12 and the second lead L1.

Figure 12:
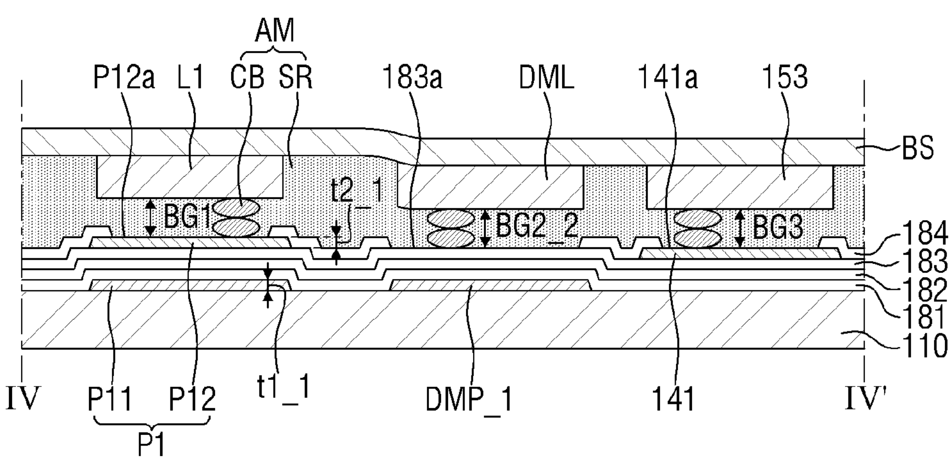
FIG. 12 is a cross-sectional view of a pad area and a printed circuit film according to still yet another embodiment.

FIG. 12 is a cross-sectional view of a pad area and a printed circuit film according to still yet another embodiment.

Referring to FIG. 12, a display device according to this embodiment is different from the display device according to FIG. 11 in that the first thickness t1_1 and the second thickness t2_1 in the display device according to this embodiment are different from the first thickness t1 and the second thickness t2 in the display device of FIG. 11.

In more detail, in this embodiment, the first thickness t1_1 and the second thickness t2_1 may be different from each other.

In the display device according to FIG. 12, when the first thickness t1_1 is smaller than the second thickness t2_1, the vertical level of the top face 183*a* of the first interlayer insulating layer 183 on the area overlapping the dummy pad DMP_1 may be lower than the vertical level of the surface 141*a* of the first pad 141.

When the first thickness t1_1 is smaller than the second thickness t2_1, and thus the vertical level of the top face 183*a* of the first interlayer insulating layer 183 on the area overlapping the dummy pad DMP_1 is lower than the vertical level of the surface 141*a* of the first pad 141, the third bonding gap BG3 between the surface 141*a* of the first pad 141 and the first lead 153 may be smaller than the third bonding gap BG3 in the display device according to FIG. 11.

In this embodiment, further including the dummy pad DMP_1 between the first upper power pad P12 and the first pad 141 may allow the second bonding gap BG2.2 to be larger than each of the first bonding gap BG1 and the third bonding gap BG3, and allow the third bonding gap BG3 to be smaller than the first bonding gap BG1. Thus, the contact resistance between the surface 141*a* of the first pad 141 and the first lead 153 may be prevented from being larger than the contact resistance between the surface P12*a* of the first upper power pad P12 and the second lead L1.

Figure 13:
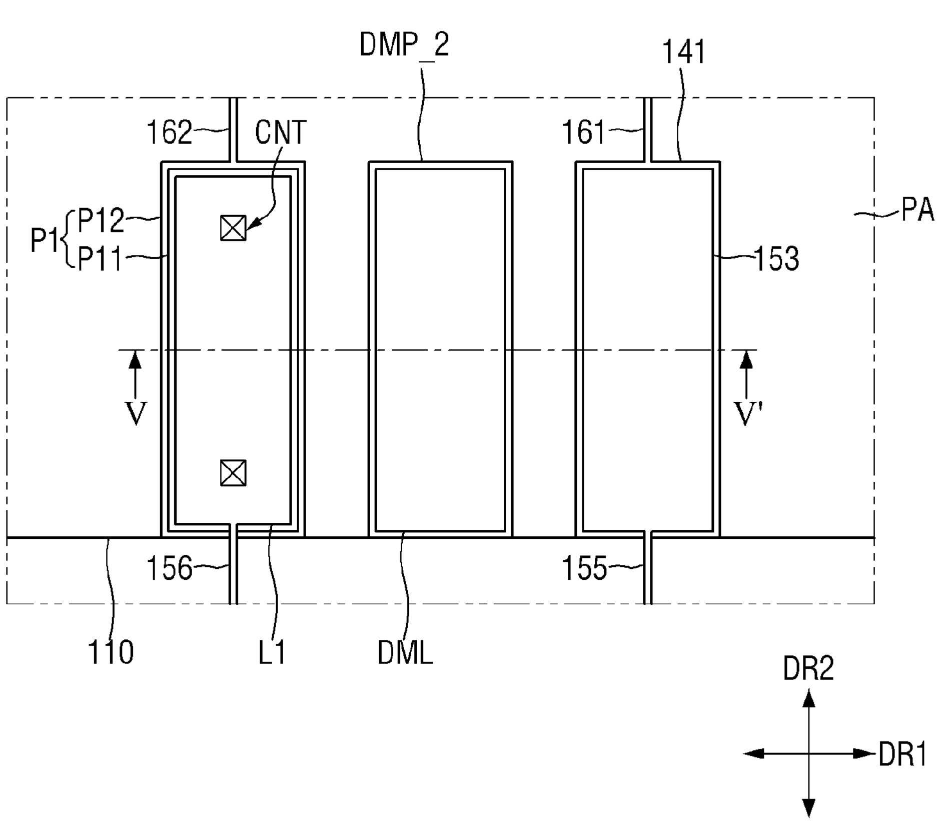
FIG. 13 is an enlarged plan view of a pad area and a printed circuit film attached to the pad area according to still yet another embodiment.
Figure 14:
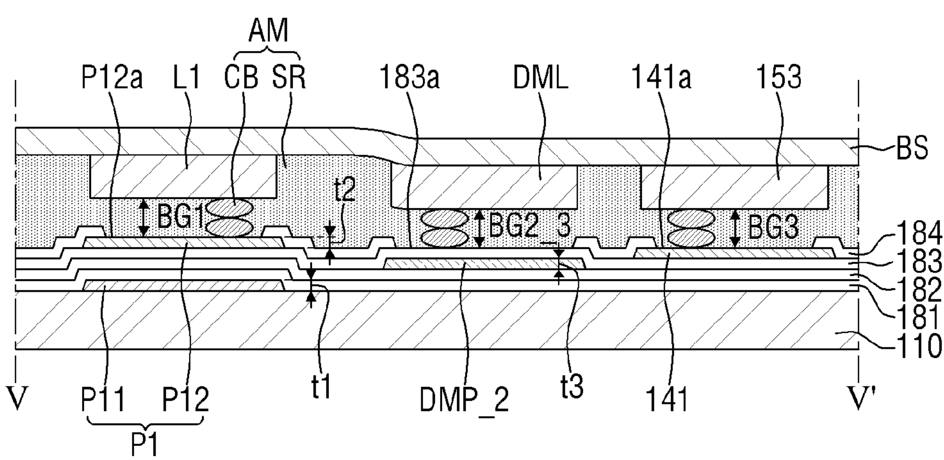
FIG. 14 is a cross-sectional view taken along a line V-V in FIG. 13.

FIG. 13 is an enlarged plan view of a pad area and a printed circuit film attached to the pad area according to still yet another embodiment. FIG. 14 is a cross-sectional view taken along a line V-V in FIG. 13.

Referring to FIGS. 13 and 14, a display device according to this embodiment is different from the display device according to FIGS. 5 and 7 in that the display device according to this embodiment further includes a third conductive layer between the gate insulating layer 182 and the first interlayer insulating layer 183.

More specifically, the display device according to this embodiment may further include the third conductive layer between the gate insulating layer 182 and the first interlayer insulating layer 183. The second conductive layer may not include the dummy pad, while the third conductive layer may include a dummy pad DMP_2.

The third conductive layer may include at least one metal selected from a group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The first conductive layer may have a first thickness t1, and the second conductive layer may have a second thickness t2, and the third conductive layer may have a third thickness t3. The third thickness t3 may be equal to the first thickness t1.

The surface P12*a* of the first upper power pad P12 and the second lead L1 may be spaced from each other by a first bonding gap BG1. The top face 183*a* of the first interlayer insulating layer 183 on the overlapping area with the dummy pad DMP_2 and the dummy lead DML may be spaced from each other by a second bonding gap BG2_3. The surface 141*a* of the first pad 141 and the first lead 153 may be spaced from each other by a third bonding gap BG3.

In this embodiment, further including the dummy pad DMP_2 between the first upper power pad P12 and the first pad 141 may allow the second bonding gap BG2_3 to be larger than each of the first bonding gap BG1 and the third bonding gap BG3, and allow the third bonding gap BG3 to be smaller than the first bonding gap BG1. Thus, the contact resistance between the surface 141*a* of the first pad 141 and the first lead 153 may be prevented from being larger than the contact resistance between the surface P12*a* of the first upper power pad P12 and the second lead L1.

Figure 15:
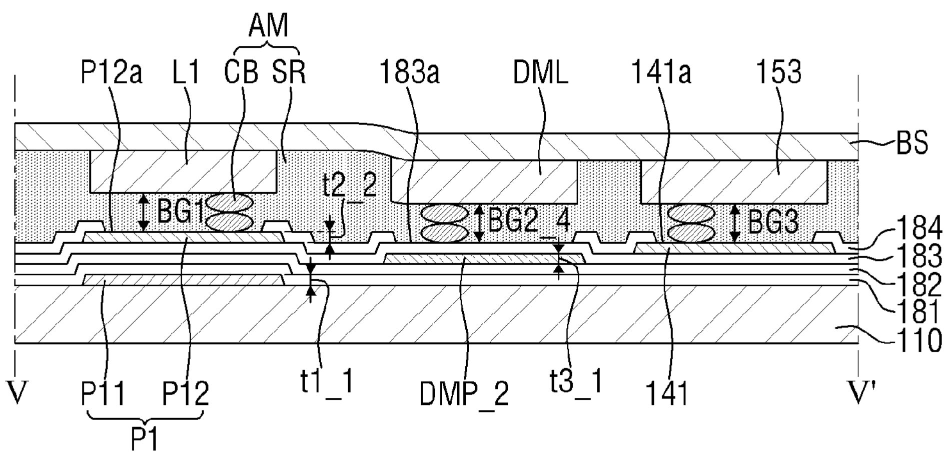
FIG. 15 is a cross-sectional view of a pad area and a printed circuit film according to still yet another embodiment.

FIG. 15 is a cross-sectional view of a pad area and a printed circuit film according to still yet another embodiment.

Referring to FIG. 15, in a display device according to this embodiment, a third thickness t3_1 may be smaller than a second thickness t2_2.

When the third thickness t3_1 is smaller than the second thickness t2_2, the vertical level of the top face 183*a* of the first interlayer insulating layer 183 on the area overlapping the dummy pad DMP_2 may be lower than the vertical level of the surface 141*a* of the first pad 141. In this case, the third bonding gap BG3 between the surface 141*a* of the first pad 141 and the first lead 153 may be smaller than the third bonding gap BG3 in the display device according to FIG. 14.

Figure 16:
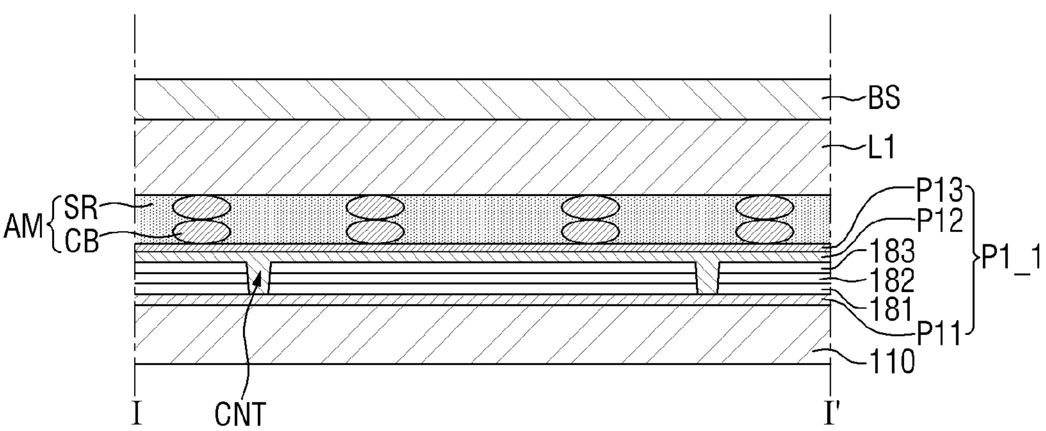
FIG. 16 and FIG. 17 are cross-sectional views of a pad area and a printed circuit is film according to still yet another embodiment.
Figure 17:
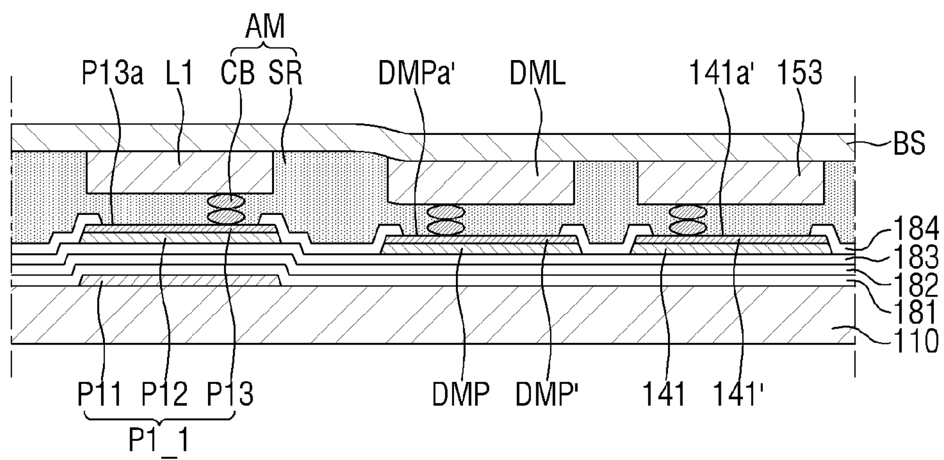

FIG. 16 and FIG. 17 are cross-sectional views of a pad area and a printed circuit film according to still yet another embodiment.

Referring to FIGS. 16 and 17, a display device according to this embodiment is different from the display device according to FIGS. 6 and 7 in that the display device according to this embodiment further includes a third conductive layer disposed on the second conductive layer.

More specifically, the display device according to this embodiment may further include the third conductive layer disposed on the second conductive layer. The third conductive layer may be disposed between the second conductive layer and the second interlayer insulating layer 184.

The third conductive layer may further include an upper pad P13 directly disposed on the first upper power pad P11, a sub-dummy pad DMP' disposed directly on the dummy pad DMP, and a first sub-pad 141' disposed directly on the first pad 141.

The second interlayer insulating layer 184 may expose a center region of the upper pad P13, expose a center region of the sub-dummy pad DMP', and expose a center region of the first sub-pad 141'.

The anisotropic conductive film AM may directly contact the exposed center region of the upper pad P13, the exposed center region of the sub-dummy pad DMP', and the exposed center region of the first sub-pad 141'.

The third conductive layer may include a transparent conductive layer.

For example, the third conductive layer may include indium-zinc-oxide (IZO), or indium-tin-oxide (ITO). However, the embodiments described herein are not limited thereto.

In this embodiment, the third conductive layer further includes the upper pad P13 directly disposed on the first upper power pad P11, the sub-dummy pad DMP' disposed directly on the dummy pad DMP, and the first sub-pad 141' disposed directly on the first pad 141, such that a total resistance of the first power pad P1_1, the dummy pads DMP and DMP', and the first pads 141 and 141' may be lowered.

Figure 18:
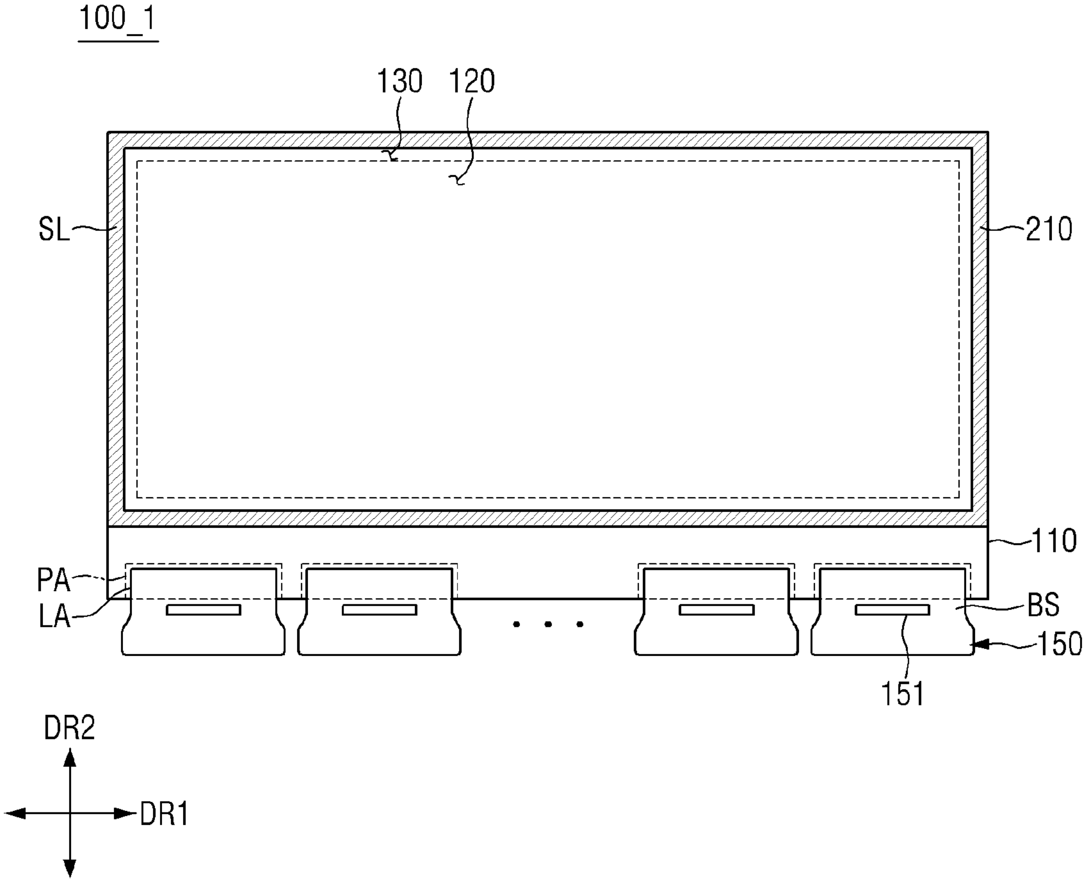
FIG. 18 is a plan view of a display device according to another embodiment.
Figure 19:
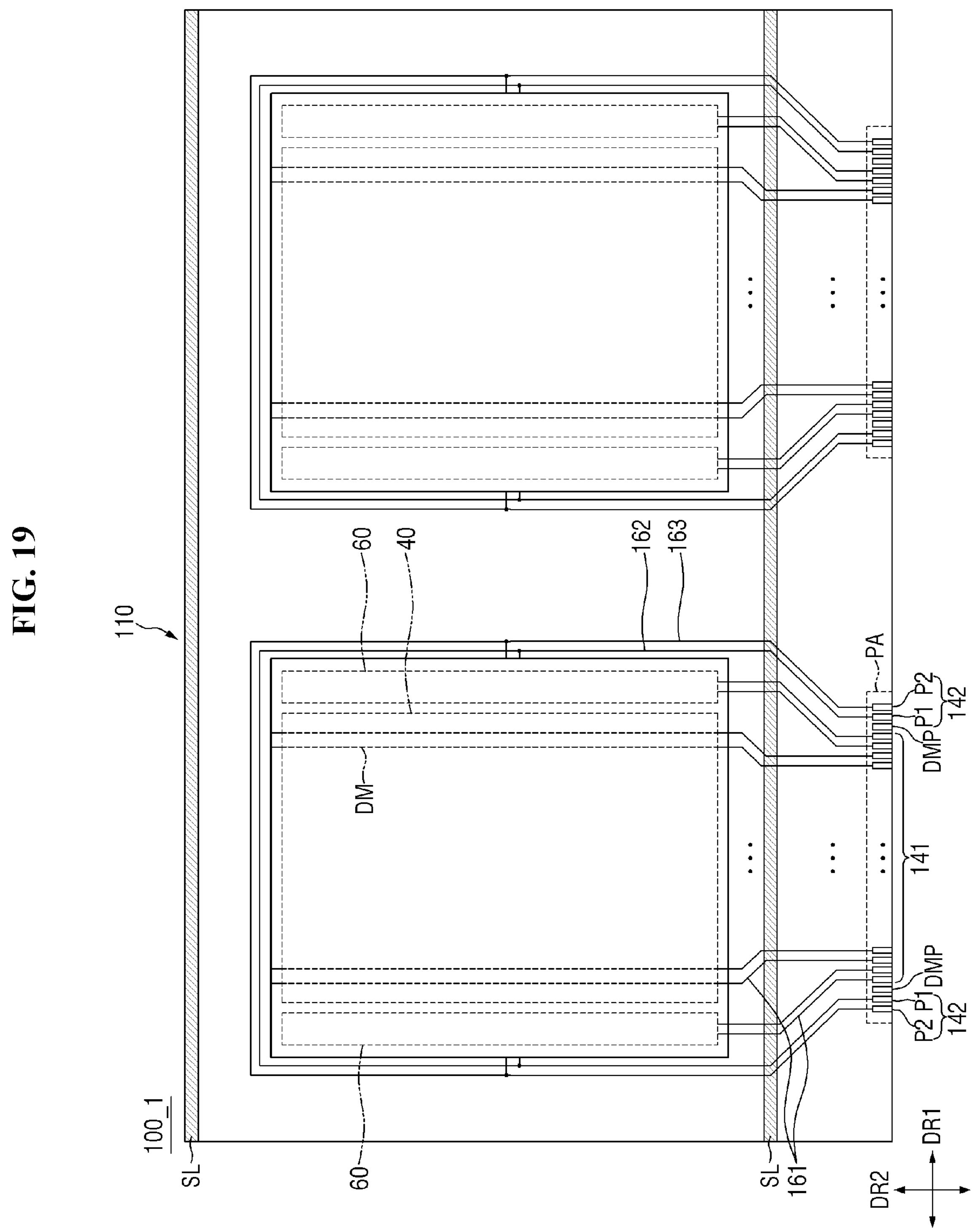
FIG. 19 is a plan view showing pad areas and printed circuit films respectively attached to the pad areas in FIG. 18.
Figure 20:
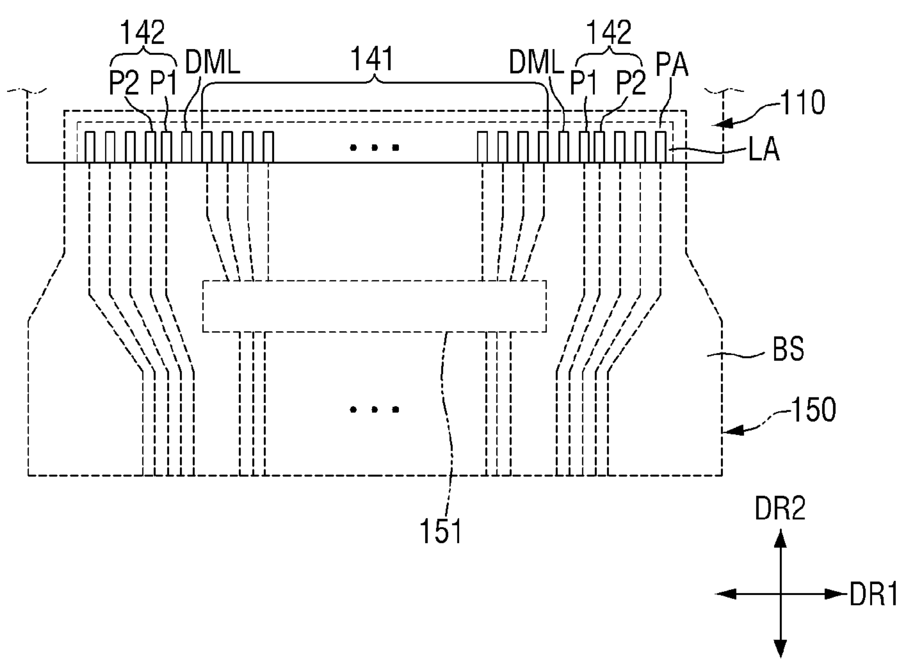
FIG. 20 is a detailed plan view showing the pad area and the printed circuit film attached to the pad area of FIG. 19.

FIG. 18 is a plan view of a display device according to another embodiment. FIG. 19 is a plan view showing pad areas and printed circuit films respectively attached to the pad areas in FIG. 18. FIG. 20 is a detailed plan view showing each pad area and each printed circuit film attached to each pad area in FIG. 19.

Referring to FIG. 18 to FIG. 20, a display device 100_1 according to this embodiment is different from the display device 100 according to FIG. 2 in that the display device 100_1 may include not only the substrate 110 but also an upper substrate 210 on the substrate 110.

More specifically, the display device 100_1 may include the substrate 110 and the upper substrate 210. The upper substrate 210 may be disposed on the substrate 110. The substrate 110 may be embodied as a thin film transistor substrate, while the upper substrate 210 may act as a color conversion substrate. The color conversion substrate may include a wavelength conversion layer and/or a transmissive layer. The color conversion substrate may further include a color filter.

Planar shapes of the substrate 110 and the upper substrate 210 may be substantially the same as each other. The substrate 110 may further protrude from a bottom long-side of the upper substrate 210 downwardly in a second direction DR2.

In a plan view, a sealing area SL may surround a left short-side (left side in a first direction DR1), a right short-side (right side in the first direction DR1), a top long-side (top side in the second direction DR2) and the bottom long-side (bottom side in the second direction DR2) of the upper substrate 210. A sealing member may be disposed in the sealing area SL. The sealing member may seal the upper substrate 210 overlapping the substrate 110 in the thickness direction.

In a plan view, a display area 120 may be disposed in a middle region of the substrate 110 and a non-display area 130 may be disposed around the display area 120. The sealing area SL may be disposed in the non-display area 130.

The printed circuit film 150 as described above in FIG. 2 may be disposed on a protruding portion of the substrate 110 further protruding from the bottom long-side of the upper substrate 210 downwardly in the second direction DR2. The protruding portion may be included in the non-display area 130.

The printed circuit film 150 may include a plurality of printed circuit films 150. For example, the number of the printed circuit films 150 may be 10, but may vary as necessary. The plurality of printed circuit films 150 may be repeatedly arranged along the first direction DR1.

Detailed descriptions of the printed circuit film 150 are the same as described above in FIG. 3 and FIG. 4 and thus are omitted for sake of brevity.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:

a display area; and a pad area that contains a first pad for supplying a data signal to the display area, a plurality of second pads located outside the first pad for transmitting a direct current (DC) signal, and a dummy pad located between the first pad and a group of the plurality of second pads, wherein the dummy pad is immediately adjacent to the first pad and the group of the plurality of second pads, wherein each of the first pad, the plurality of second pads, and the dummy pad has a surface as a top face thereof, wherein each of the surface of the first pad, the surface of the plurality of second pads, and the surface of the dummy pad has a corresponding vertical level in a thickness direction of the display device, wherein a vertical level of the surface of each of the plurality of second pads is higher than a vertical level of the surface of the first pad, and wherein a vertical level of the surface of the dummy pad is lower than or equal to the vertical level of the surface of the first pad.

2. The display device of claim 1, wherein the device further comprises a data driver disposed between the display area and the pad area, and wherein the first pad is connected to the data driver, while the plurality of second pads are not connected to the data driver.

3. The display device of claim 2, wherein the dummy pad includes a floating electrode.

4. The display device of claim 3, wherein the DC signal includes a first power signal, and a second power signal greater than the first power signal, and wherein the plurality of second pads includes a first power pad for supplying the first power signal to the display area, and a second power pad for supplying the second power signal to the display area.

5. The display device of claim 3, wherein at least one of the plurality of second pads includes a lower pad, and an upper pad, wherein the upper pad overlaps the lower pad in the thickness direction, and is electrically connected thereto.

6. The display device of claim 5, wherein the display device further comprises:

a substrate;

a first conductive layer on the substrate;

a buffer layer on the first conductive layer;

a gate insulating layer on the buffer layer;

a first interlayer insulating layer on the gate insulating layer; and a second conductive layer on the first interlayer insulating layer, wherein the first conductive layer includes the lower pad, and wherein the second conductive layer includes the upper pad, the first pad, and the dummy pad.

7. The display device of claim 6, wherein the upper pad is connected to the lower pad via a contact hole, and wherein the contact hole passes through the first interlayer insulating layer, the gate insulating layer, and the buffer layer.

8. The display device of claim 7, wherein the device further comprises:

a base film facing away from the substrate;

a lead area that contains a first lead, a plurality of second leads, and a dummy lead disposed on one face of the base film facing the substrate; and an anisotropic conductive film disposed between the lead area and the pad area, wherein the first lead overlaps the first pad, the second lead overlaps the plurality of second pads, and the dummy lead overlaps the dummy pad.

9. The display device of claim 8, wherein the device further comprises a second interlayer insulating layer on the second conductive layer, and wherein the second interlayer insulating layer is disposed on the first pad so as to expose a center region of the first pad, is disposed on the plurality of second pads so as to expose a center region of at least one of the plurality of second pads, and is disposed on the dummy pad so as to expose a center region of the dummy pad.

10. The display device of claim 9, wherein the anisotropic conductive film is in direct contact with the exposed center region of the first pad, the exposed center region of the at least one of the plurality of second pads, and the exposed center region of the dummy pad.

11. The display device of claim 10, wherein the device further comprises a third conductive layer disposed on the second conductive layer, and wherein the third conductive layer includes a further upper pad disposed directly over the upper pad of the at least one of the plurality of second pads, a sub-dummy pad disposed directly over the dummy pad, and a first sub-pad disposed directly over the first pad.

12. The display device of claim 11, wherein the third conductive layer includes a transparent conductive layer, wherein the second conductive layer includes a non-transparent conductive layer.

13. The display device of claim 8, wherein the upper pad and the second lead are spaced from each other by a first bonding gap, and wherein the dummy pad and the dummy lead are spaced from each other by a second bonding gap, wherein the first pad and the first lead are spaced from each other by a third bonding gap, wherein the second bonding gap is larger than each of the first bonding gap and the third bonding gap, and wherein the third bonding gap is smaller than the first bonding gap.

14. The display device of claim 3, wherein the dummy pad includes a plurality of dummy pads.

15. A display device comprising:

a display area; and a pad area that contains a first pad for supplying a data signal to the display area, a plurality of second pads located outside the first pad for transmitting a direct current (DC) signal, and a dummy pad located between the first pad and a group of the plurality of second pads, wherein the dummy pad is immediately adjacent to the first pad and the group of the plurality of second pads, wherein the display device further comprises:

a substrate;

a first conductive layer provided on the substrate;

a buffer layer provided on the first conductive layer;

a gate insulating layer provided on the buffer layer;

an interlayer insulating layer provided on the gate insulating layer; and a second conductive layer provided on the interlayer insulating layer, wherein at least one of the plurality of second pads includes a lower pad, and an upper pad, wherein the upper pad overlaps the lower pad in a thickness direction of the display device, and is electrically connected to the lower pad, wherein the first conductive layer includes the lower pad, wherein the second conductive layer includes the upper pad and the first pad, and wherein the dummy pad is disposed in the first conductive layer or the second conductive layer.

16. The display device of claim 15, wherein the device further comprises a data driver disposed between the display area and the pad area, and wherein the first pad is connected to the data driver, and wherein the plurality of second pads are not connected to the data driver.

17. The display device of claim 16, wherein the dummy pad includes a floating electrode.

18. The display device of claim 17, wherein the DC signal includes a first power signal, and a second power signal having a signal level greater than the first power signal, and wherein the plurality of second pads include a first power pad for supplying the first power signal to the display area, and a second power pad for supplying the second power signal to the display area.

19. The display device of claim 18, wherein the upper pad is connected to the lower pad via a contact hole, and wherein the contact hole passes through the interlayer insulating layer, the gate insulating layer, and the buffer layer.

20. The display device of claim 19, wherein the device further comprises:

a base film facing away from the substrate;

a lead area that contains a first lead, a plurality of second leads, and a dummy lead disposed on one face of the base film facing the substrate; and an anisotropic conductive film disposed between the lead area and the pad area, wherein the first lead overlaps the first pad, the second lead overlaps the at least one of the plurality of second pads, and the dummy lead overlaps the dummy pad.

* * * * *